US011378597B2

(12) United States Patent
Pramod et al.

(10) Patent No.: US 11,378,597 B2
(45) Date of Patent: Jul. 5, 2022

(54) CLOSED-LOOP COMPENSATION OF CURRENT MEASUREMENT OFFSET ERRORS IN ALTERNATING CURRENT MOTOR DRIVES

(71) Applicant: Steering Solutions IP Holding Corporation, Saginaw, MI (US)

(72) Inventors: Prerit Pramod, Saginaw, MI (US); Zhe Zhang, Fenton, MI (US); Krishna MPK Namburi, Okemos, MI (US); Infane O. Lowe, Flint, MI (US); Aparna Saha, Saginaw, MI (US)

(73) Assignee: Steering Solutions IP Holding Corporation, Saginaw, MI (US)

( * ) Notice: Subject to any disclaimer, the term of this patent is extended or adjusted under 35 U.S.C. 154(b) by 292 days.

(21) Appl. No.: 16/699,539

(22) Filed: Nov. 29, 2019

(65) Prior Publication Data

US 2021/0165022 A1 Jun. 3, 2021

(51) Int. Cl.
| G01R 19/00 | (2006.01) |
| H02K 21/16 | (2006.01) |
| H02P 21/22 | (2016.01) |
| H02P 29/024 | (2016.01) |

(52) U.S. Cl.
CPC ......... *G01R 19/0092* (2013.01); *H02K 21/16* (2013.01); *H02P 21/22* (2016.02); *H02P 29/024* (2013.01)

(58) Field of Classification Search
CPC ..... G01R 19/0092; H02K 21/16; H02P 21/22; H02P 29/024; H02P 21/14; H02P 21/20; H02P 27/12
See application file for complete search history.

(56) References Cited

U.S. PATENT DOCUMENTS

| 5,070,956 | A | 12/1991 | Pawlak et al. | |
| 5,956,836 | A | 9/1999 | Dupuie | |
| 6,598,695 | B1 | 7/2003 | Menjak et al. | |
| 6,804,592 | B2 | 10/2004 | Klein et al. | |
| 6,814,374 | B2 | 11/2004 | Riefe | |
| 7,161,323 | B2 * | 1/2007 | Ajima | H02P 6/10 318/629 |
| 7,380,828 | B2 | 6/2008 | Menjak et al. | |
| 9,802,642 | B2 | 10/2017 | Ballal et al. | |
| 9,806,656 | B1 | 10/2017 | Pramod et al. | |
| 9,873,450 | B2 | 1/2018 | Pramod et al. | |
| 9,966,890 | B2 | 5/2018 | Pramod et al. | |
| 10,340,827 | B2 | 7/2019 | Pramod et al. | |
| 2005/0057212 | A1 * | 3/2005 | Harbaugh | H02P 21/22 318/809 |
| 2017/0366128 | A1 * | 12/2017 | Vaks | H02P 25/092 |

OTHER PUBLICATIONS

U.S. Appl. No. 16/177,265, filed Oct. 31, 2018 and titled "Feedforward Control of Permanent Magnet Synchronous Motor Drive Under Current Sensing Failure".

* cited by examiner

*Primary Examiner* — Akm Zakaria
(74) *Attorney, Agent, or Firm* — Dickinson Wright PLLC

(57) ABSTRACT

Systems and methods for compensating for a current measurement offset error in a permanent magnet synchronous motor (PMSM) drive are disclosed. The systems and methods include reading an output voltage command signal, extracting a signature of a current measurement offset error from the output voltage command signal, and compensating, based on the signature, for the current measurement offset error in a closed-loop using a feedback path.

20 Claims, 4 Drawing Sheets

CLOSED-LOOP COMPENSATION OF CURRENT MEASUREMENT OFFSET ERRORS IN ALTERNATING CURRENT MOTOR DRIVES

TECHNICAL FIELD

This disclosure relates to current measurement offset errors and in particular to systems and methods for closed-loop compensation of current measurement offset errors in permanent magnet synchronous motor drives.

BACKGROUND

Vehicles, such as cars, trucks, sport utility vehicles, crossovers, mini-vans, or other suitable vehicles, may include an electric power steering (EPS) system. Such EPS systems typically include an electric motor for providing steering assist during operation of a vehicle. To provide such steering assist, the EPS system may drive the electric motor according to a method of torque control. The electric motor may include a permanent magnet synchronous motor (PMSM) drive. When using a PMSM drive, the EPS system may utilize a field oriented control (FOC). FOC transforms an alternating current (AC) phase motor voltage and current signals in a stationary reference frame to a synchronously rotating reference frame, commonly referred to as the d/q axis reference frame, in which the motor voltages and currents become direct current (DC) quantities. FOC torque control is commonly implemented through a closed loop current control method that employs current regulators to minimize the error between commanded and measured currents to achieve perfect current tracking. Thus, current control requires the motor currents to be measured, which may be achieved by measuring the phase currents of the PMSM drive, which are then transformed into the synchronous frame via a park transform to perform the control in the synchronous reference frame.

When an offset error of a certain magnitude occurs in a phase current measurement, the closed loop current controller operating in the synchronous reference frame adjusts the motor voltage so that the measurement of motor current matches the commanded current. Since the measurement is incorrect, the current controller causes the actual motor currents to become incorrect. This failure mode results in motor position dependent motor torque and current errors, which may be perceived as a large torque ripple at the motor shaft, and potentially larger than rated motor currents (for the hardware design). When the torque ripple caused by the phase current measurement offset error exceeds a certain threshold, the offset error can produce motor torque in the opposite direction from the motor torque command. When used in EPS systems, failures, which produce torque in a direction opposite to the desired motor torque command, result in a situation where instead of providing steering assistance, the driver ends up needing to apply higher efforts than if the vehicle were operating in manual steering mode, i.e., without an active EPS system.

SUMMARY

This disclosure relates generally to detection of current measurement offset errors.

An aspect of the disclosed embodiments includes a system for compensating for a current measurement offset error in an alternating current (AC) motor drive. The system includes a processor and a memory. The memory includes instructions that, when executed by the processor, cause the processor to: read an output voltage signal, extract a signature of a current measurement offset error from the output voltage signal, and compensate, based on the signature, for the current measurement offset error in a closed-loop using a feedback path.

Another aspect of the disclosed embodiments includes a method for compensating for a current measurement offset error in an alternating current (AC) motor drive. The method includes reading an output voltage signal, extracting a signature of a current measurement offset error from the output voltage signal, and compensating, based on the signature, for the current measurement offset error in a closed-loop using a feedback path.

Another aspect of the disclosed embodiments includes an electronic device. The electronic device includes a processor and a memory. The memory includes instructions that, when executed by the processor, cause the processor to: read an output voltage signal, extract a signature of a current measurement offset error from the output voltage signal, and compensate, based on the signature, for the current measurement offset error in a closed-loop using a feedback path.

These and other aspects of the present disclosure are disclosed in the following detailed description of the embodiments, the appended claims, and the accompanying figures.

BRIEF DESCRIPTION OF THE DRAWINGS

The disclosure is best understood from the following detailed description when read in conjunction with the accompanying drawings. It is emphasized that, according to common practice, the various features of the drawings are not to-scale. On the contrary, the dimensions of the various features are arbitrarily expanded or reduced for clarity.

DETAILED DESCRIPTION

Figure 1A:
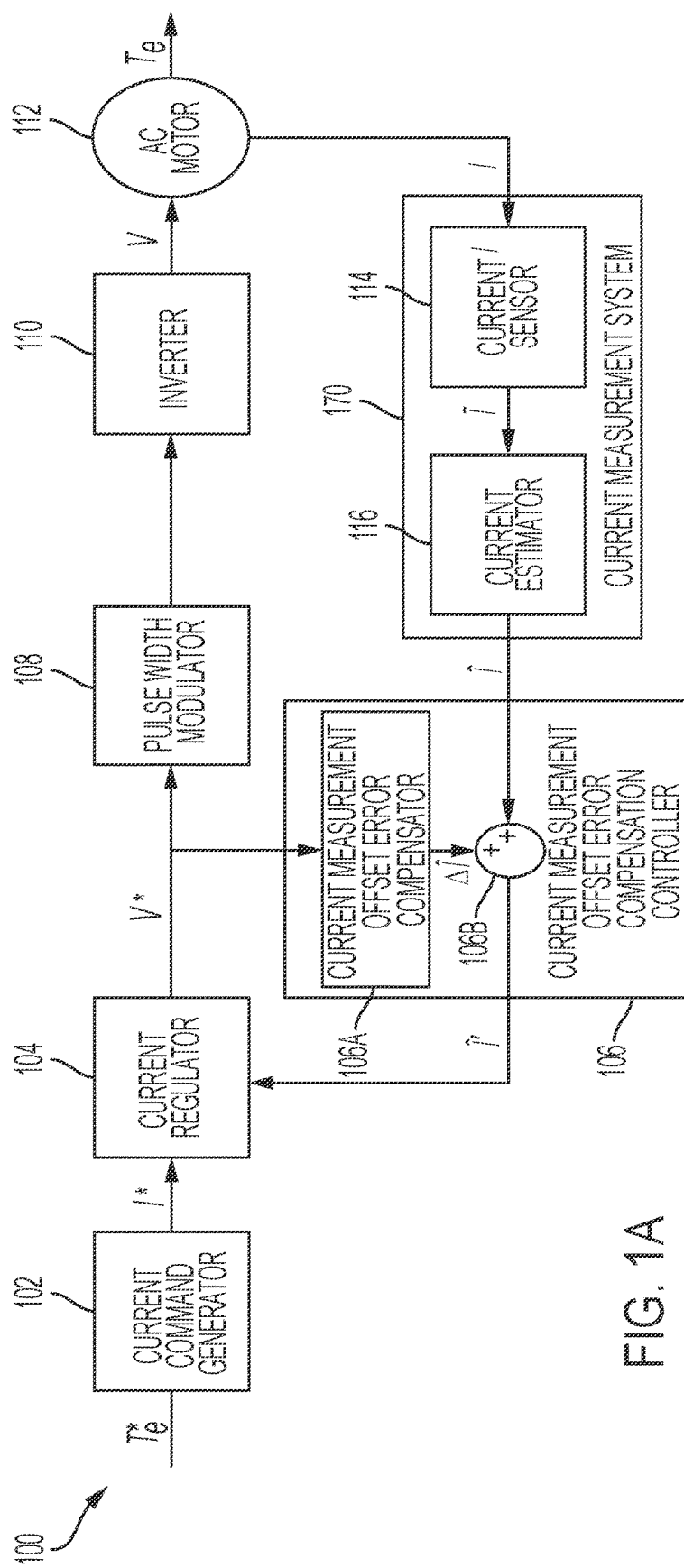
FIG. 1A-1C generally illustrate an alternating current (AC) motor drive system with closed-loop current measurement offset error compensation according to the principles of the present disclosure.

The following discussion is directed to various embodiments of the disclosed subject matter. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Some machines (e.g., vehicles, boats, airplanes, drones, power equipment, yard equipment, pumps, compressors, etc.) may include an alternating current (AC) motor drive that controls an AC motor in a closed loop. A current measurement system may be included in the closed loop to measure the current output of the synchronous motor. The machines using current measurement systems may be susceptible to current measurement offset errors.

A current measurement offset error is generated based on non-idealities or failures in current measurements. Current measurement offset errors may result from a current estimator incorrectly measuring the current output from an AC motor. In a closed-loop system using a current regulator, the current regulator produces the required output voltage signal such that the measured current becomes equal to a commanded current. In such an instance, when the measured current is different from the commanded current, the output voltage signal will be incorrect (e.g., different from an expected output voltage signal based on the commanded current) because the current regulator is attempting to match the measured current (e.g., which is different from the commanded current) with the commanded current.

Gradual changes in measurement circuitry (e.g., operational amplifier (op-amp), offset drift, etc.) may cause small current measurement offset errors. Failures of the measurement circuitry may result in larger current measurement offset errors. If left undetected and/or unmitigated, as discussed, the failure mode results in motor position dependent motor torque and current errors, which may be perceived as a large torque ripple at the motor shaft, and potentially larger than rated motor currents (for the hardware design). When the torque ripple caused by the phase current measurement offset error exceeds a certain threshold, the offset error can produce motor torque in the opposite direction from the motor torque command. When used in EPS systems, failures, which produce torque in a direction opposite to the desired motor torque command, result in a situation where instead of providing steering assistance, the driver ends up needing to apply higher efforts than if the vehicle were operating in manual steering mode, i.e., without an active EPS system.

Accordingly, the systems and methods, such as those described herein, may be configured to address the issues above by providing techniques for electronic compensation of current measurement offset errors in any AC motor drives and current measurement systems. In some embodiments, the systems and methods described herein may enable detecting, learning, and compensating for current measurement offset error induced effects on the AC motor drive. For example, using a closed-loop compensation control, the effects of current measurement offset error may be at least partially compensated for.

In some embodiments, the systems and methods described herein may be configured to provide techniques for real-time detection of inter-phase current measurement offset error in AC motor drives and current measurement systems. The systems and methods described herein may be configured to use various mathematical models to extract a signature of a current measurement offset error, compensate for the current measurement offset error using a closed-loop compensator, and correct the current measurement offset error.

In some embodiments, the systems and methods described herein may be configured to change the measured current in real-time to adjust the operation of an AC motor drive to control the AC motor in a more desirable fashion. The systems and methods described herein may result in enhanced AC motor performance, enhanced AC motor longevity, enhanced steering, and enhanced customer experience using a machine including the AC motor.

The disclosed techniques are applicable to any electric motor drives with alternative current (AC) electric machines and any current measurement architectures (both in-line and low side). A low side current measurement system may refer to placing a current sensor in series with a load between the load and the ground. An in-line current measurement system may refer to placing a current sensor in series with a circuit so that current flowing through the circuit also flow through the current sensor. Further, the disclosed embodiments may be implemented by a processor for real-time detection, identification, and/or correction while the AC motor is being operated. The disclosed embodiments may also be implemented by a processor at the end of line (EOL) at manufacturing plants.

FIG. 1A generally illustrates an alternating current (AC) motor drive system 100 (referred to as "system" herein) according to the principles of the present disclosure. The system 100 may include a current command generator 102, a current regulator 104, a current measurement offset error compensation controller 106, a pulse width modulator 108, an inverter 110, an AC motor 112, a current sensor 114 and a current estimator 116. In some embodiments, the current regulator 104, the pulse width modulator 108, the inverter 110, the AC motor 112, the current sensor 114, and the current estimator 116 form a closed-loop current control system. The depicted AC motor drive system 100 also includes another closed-loop within the current control system. For example, the current regulator 104, the current measurement offset error compensation controller 106, the current sensor 114, and the current estimator 116 form a closed-loop current measurement offset error compensation system. It should be noted that fewer or more components may be included in the system 100 as desired to perform the techniques disclosed herein and the components depicted are for explanatory purposes.

In some embodiments, the closed-loop current measurement offset error compensation system may function as follows. The current regulator 104 receives a command or reference current and outputs a corresponding output voltage command signal. The current measurement offset error compensation controller 106 receives the output voltage signal. The current measurement offset error compensation controller 106 includes a current measurement offset error compensator 106A and an addition module 106B.

Figure 1B:
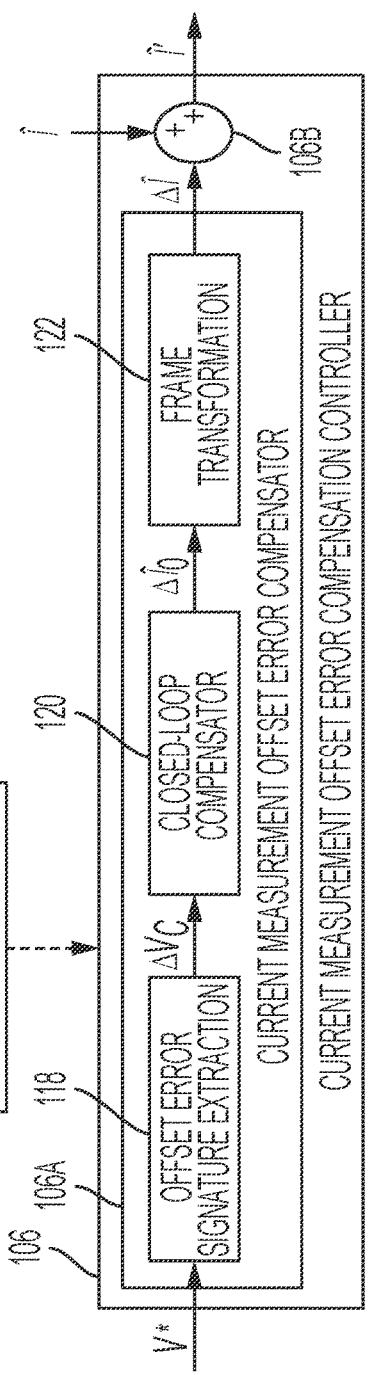

FIG. 1B illustrates a detailed block diagram of the current measurement offset error compensation controller 106 according to the principles of the present disclosure. The offset error signature extraction module 118 extracts a signature of the current measurement offset error. This error is subtracted from a zero command, i.e., the negative of the error is calculated, and sent to a closed-loop compensator 120 which generates a base current offset correction signal. The pre-transform current offset correction signal is transformed by a frame transformation module 122 to generate the final current offset correction signal. The final current offset correction signal is added to the current estimate at the addition module 106B to determine the measured currents which are input to the current regulator 104, thereby closing the loop.

With the foregoing described, additional details and operation of the AC motor drive system 100 will now be discussed. The AC motor 112 may generate rotational or linear force used to power a machine, such as those described herein. The AC motor 112 may include a constant speed motor or other suitable motor. The AC motor drive system 100 may selectively control electrical energy provided to the AC motor 112. The AC motor drive system 100 may provide the electrical energy to the AC motor 112 in varying amounts and at varying frequencies, thereby indirectly controlling the speed and torque of the AC motor 112.

A current measurement system 170 may include the current sensor 114 and the current estimator 116. The current sensor 114 may include any suitable current sensor configured to sense or measure an electric current in a circuit. The current sensor may provide signals indicating the current to the current estimator 116. The current sensor may be configured to receive the signals indicating the current and to measure the amount of current output by the AC motor 112 (e.g., based on the current indicated by the signals). The current estimator 116 may be configured to either transmit the stationary frame currents of the AC motor 112 or transform the measured current using a position estimate of the AC motor 112 into a synchronous reference frame.

The current command generator 102 may receive a torque command $T_e^*$. The current command generator 102 may generate a commanded current I* based on the torque command. The current command may be composed of a direct axis (d-axis) $I_d^*$ and a quadrature axis (q-axis) $I_q^*$ current component. The current regulator 104 receives the commanded current and transmits an output voltage command signal V* to the pulse width modulator 108. The voltage command may be composed of a d-axis component $V_d^*$ and a q-axis component $V_q^*$. The pulse width modulator 108 may control the proportion of time the output voltage signal is high compared to when it is low over a consistent period of time, which may control the direction of the AC motor 112. The inverter 110 may include a voltage source inverter or other suitable inverter and may be configured to vary the frequency of the supply electrical energy provided to the AC motor 112 to control the speed of the AC motor 112. The AC motor 112 may receive an output voltage signal V as an input. The AC motor 112 may use the input to generate an amount of current I as output that may be equal to the commanded current or vary from the commanded current (e.g., when there is a current measurement offset error).

The current I output from the AC motor 112 may be sensed by the current sensor 114 to determine the measured current Ĩ. The current estimator 116 may receive the measured current Ĩ and determine the estimated current Î. The current estimator 116 of the current measurement system 170 outputs the estimated current Î to the current regulator 104. Accordingly, as depicted a closed-loop is used by the system 100. However, as discussed, in some instances, the measured current may be incorrect due to circuitry degradation, drift, or the like.

The current regulator 104 may receive the estimated current and compare it to the commanded current. If there is any variation, the current regulator 104 may transmit an output voltage command signal V* that will cause the estimated current to closely match the commanded current I*. As such, since the commanded current I* is constant (or varying slowly) and the estimated current I equals the commanded current I*, then the estimated current Î is also constant. When an offset error exists in the current measurement system, the current regulator 104 may include a pulsating component in the output voltage command signal V*.

Figure 1C:
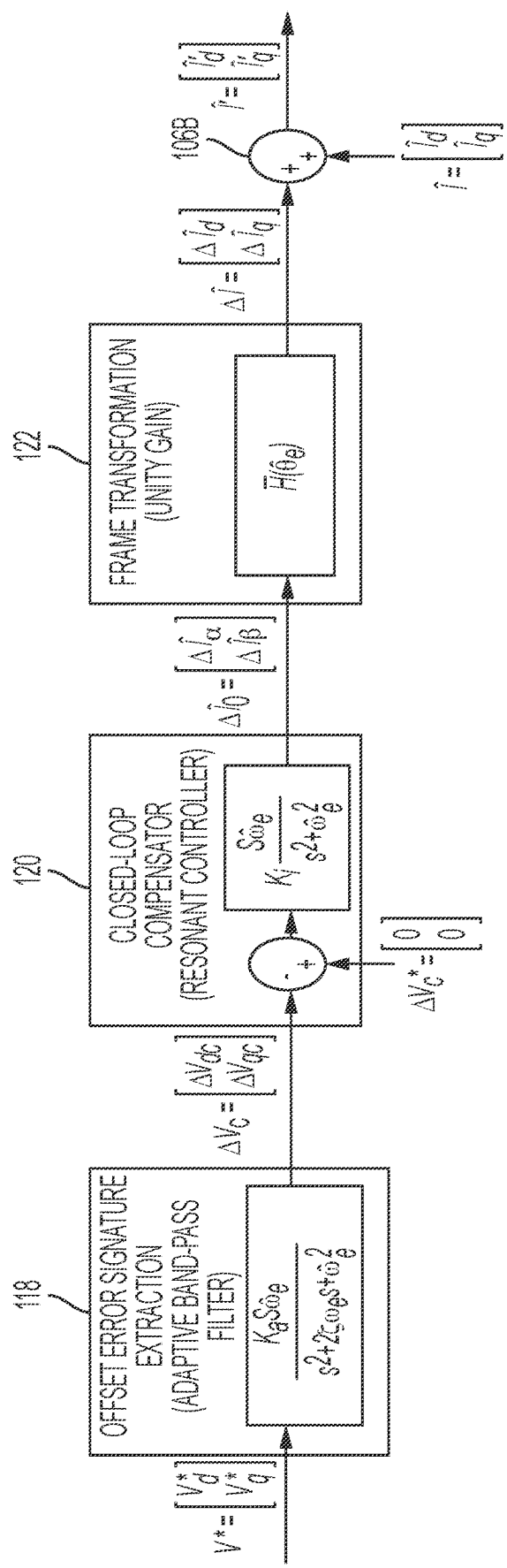

The current measurement offset error compensation controller 106 reads the output voltage command signal from the current regulator 104. The current measurement offset error compensation controller 106 may include a current measurement offset error compensator 106A that contains an offset error signature extraction module 118, a closed-loop compensator 120, and a frame transformation module 122. As will be described, the offset error signature extraction module 118 may use mathematical models to extract a signature of the current measurement offset error from the output voltage command signal. The offset error signature extraction module 118 may identify the signature of the current measurement offset error as a pulsating frequency of first electrical order in the output voltage command signal. In some embodiments, the offset error signature extraction module 118 may use an adaptive band-pass filter to extract the filter as depicted in FIG. 1C. The adaptive band-pass filter may be configured to perform pre-filtering in the synchronous frame before transformation or use adaptive low-pass filters in the pseudo-stationary framed tuned (adaptively) in accordance with the pulsation frequency equal to the synchronous frequency, i.e., of first electrical order. In some embodiments, the offset error signature extraction module 118 may perform direct sinusoidal error extraction on the output voltage command signal. In some embodiments, the offset error signature extraction 118 may perform demodulation to convert the sinusoidal part of the output voltage command signal to a DC signal and thereafter perform low-pass filtering.

As will be described, the closed-loop compensator 120 may receive the signature and use either an adaptive resonator for a sinusoidal signature to produce the base current offset correction or a conventional integrator for a DC signature to produce the base current offset correction. As depicted in FIG. 1C, in the case of a sinusoidal signature of the current measurement offset error extracted from the output voltage command signal, a resonant controller may be used to produce the base offset correction. The resonant controller receives the difference of a pseudo-command input $\Delta V_c^*$ equal to zero and the filtered sinusoidal voltage component $\Delta V_c$ and generates a base current offset correction signal $\Delta \hat{I}_0$. The resonant controller is adaptive in nature, i.e., designed to eliminate any error at its input that is at its critical frequency which in this case is equal to the estimated synchronous frequency $\hat{\omega}_e$. The frame transformation module 122 converts the base current offset correction signal into a final current offset correction signal $\Delta \hat{I}$ by applying a position dependent reference frame transformation $\overline{H}(\hat{\theta}_e)$ utilizing the estimated electrical position $\hat{\theta}_e$. The addition module 106B adds the final current offset error correction signal $\Delta \hat{I}$ to the estimated current $\hat{I}$ to compensate for the current measurement offset error and generate a compensated estimated current $\hat{I}'$ that is transmitted to the current regulator 104 in real-time to alleviate any effects of the current measurement offset error.

The following discussion pertains to the mathematical models used the systems and methods described herein. The measured currents with offset errors in the stationary reference frame may be mathematically expressed as, $$\tilde{I}_\alpha = I_\alpha + \Delta I_\alpha$$

$$\tilde{I}_\beta = I_\beta + \Delta I_\beta \qquad \text{Equation 1.}$$

where $\Delta I_\alpha$ and $\Delta I_\beta$ are the offset errors in the stationary reference frame and represent the deviation of the measured currents $\tilde{I}_\alpha$ and $\tilde{I}_\beta$ from the actual currents $I_\alpha$ and $I_\beta$ respectively.

When transformed into the synchronous reference frame utilizing the reference frame transformation $\overline{H}(\hat{\theta}_e)$, the estimated d/q currents $\hat{I}_d$ and $\hat{I}_q$ become, $$\hat{I}_d = I_d + \Delta I_d = I_d + I_0 \cos(\hat{\theta}_e - \theta)$$

$$\hat{I}_q = I_q + \Delta I_q = I_q + I_0 \sin(\hat{\theta}_e - \theta) \qquad \text{Equation 2.}$$

where $\Delta I_d$ and $\Delta I_q$ are the current measurement errors in the synchronous reference frame, $I_d$ and $I_q$ are the actual currents and $$I_0 = \sqrt{\Delta I_\alpha^2 + \Delta I_\beta^2} \text{ and } \phi = \tan^{-1}\left(\frac{\Delta I_\beta}{\Delta I_\alpha}\right).$$

Note that the transformation matrices are, $$\begin{bmatrix} X_d \\ X_q \end{bmatrix} = \overline{\overline{H}}(\theta_e) = \begin{bmatrix} \cos\theta_e & \sin\theta_e \\ \sin\theta_e & -\cos\theta_e \end{bmatrix} \begin{bmatrix} X_\alpha \\ X_\beta \end{bmatrix} \quad \text{Equation 3}$$

$$\begin{bmatrix} X_\alpha \\ X_\beta \end{bmatrix} = \overline{\overline{H}}(\theta_e) = \begin{bmatrix} \cos\theta_e & \sin\theta_e \\ \sin\theta_e & -\cos\theta_e \end{bmatrix} \begin{bmatrix} X_d \\ X_q \end{bmatrix}.$$

where X could represent voltages or currents.

Assuming that the high performance current regulators have sufficiently high bandwidth, the estimated currents may be assumed to be approximately equal to the commanded currents, causing the actual currents to become distorted. The actual currents can be expressed as, $$I_{dq} = \hat{I}_{dq} + \Delta I_{dq} \approx I_{dq}^* \Delta I_{dq} \quad \text{Equation 4.}$$

The pulsating component of the voltage commands can then be computed as, $$\Delta V_d^* \approx I_0 Z_q \cos(\theta_e - \theta - \psi_q)$$

$$\Delta V_q^* \approx I_0 Z_d \sin(\theta_e - \theta - \psi_d) \quad \text{Equation 5.}$$

where $$Z_{dq} = \sqrt{R^2 + \omega_e^2 L_{qd}^2}, \psi_{dq} = \tan^{-1}\left(\frac{\omega_e L_{qd}}{R}\right),$$

and $\omega_e$, R, $L_d$, $L_q$ are synchronous frequency (electrical motor velocity), the motor resistance, d-axis inductance and q-axis inductance respectively. Thus, when a current measurement offset error is present, the output voltage commands may be filtered using an adaptive band-pass filter tuned at the synchronous frequency $\omega_e$ to extract the pulsating components $\Delta V_c$ as shown in FIG. 1C in the offset error signature extraction module 118. Note that $\Delta V_c$ is equal to $\Delta V^*$ given in Equation 5. The resonant controller 120 then operates on the error signature and outputs the base offset error correction term $\Delta \hat{I}_0$ which is transformed into the final offset error correction term $\Delta \hat{I}$ by the reference frame transformation module 122 and added at the addition module 106B to the estimated currents $\hat{I}$ to obtain the final estimated currents in the synchronous reference frame which are inputs to the current regulator 104. This closed-loop system forces the current measurement offset error to become zero thus mitigating the pulsations in the output currents due to offset errors in the measured currents.

Figure 2:
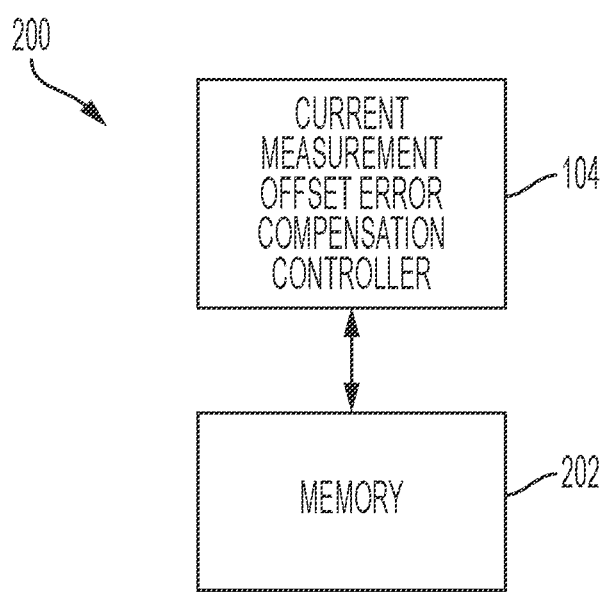
FIG. 2 generally illustrates a controller system according to the principles of the present disclosure.

FIG. 2 generally illustrates a controller system 200 according to the principles of the present disclosure. The controller system 200 includes the current measurement offset error compensation controller 106 communicatively coupled to a memory 202. The current measurement offset error compensation controller 106 may include a processor. The processor may include any suitable processor, such as those described herein. The memory 202 may store instructions that, when executed by the current measurement offset error compensation controller 106, cause the current measurement offset error compensation controller 106 to, at least, perform the techniques disclosed herein. In particular, the computer instructions, when executed by the current measurement offset error compensation controller 106, may cause the current measurement offset error compensation controller 106 to perform the operations of the method 300 as further described below with reference to FIG. 3.

Figure 3:
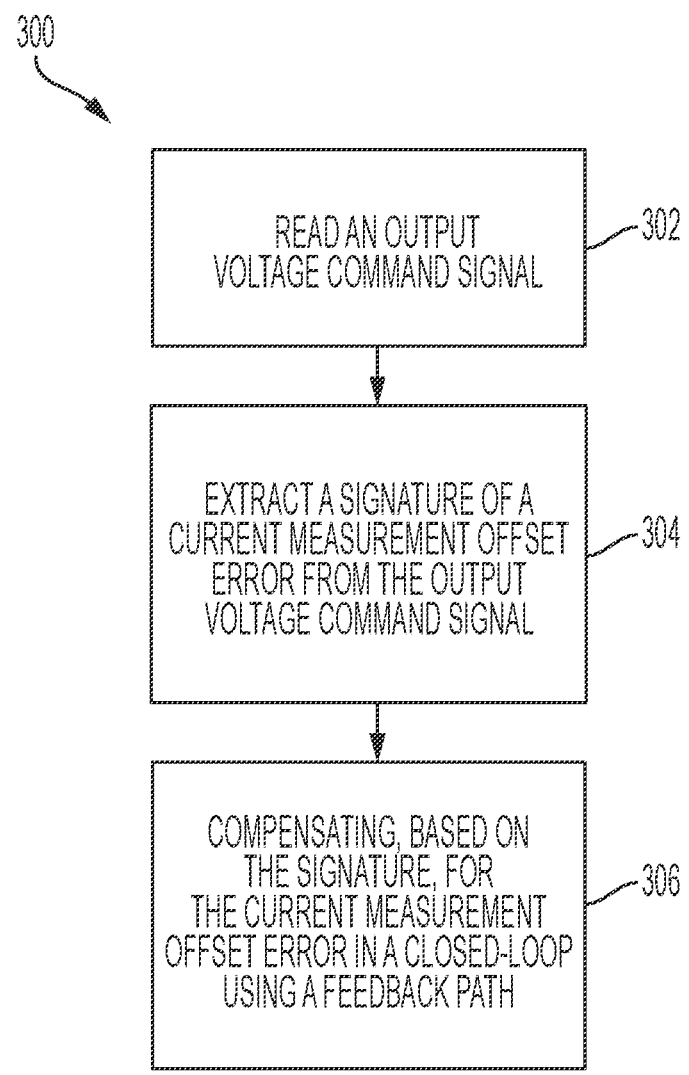
FIG. 3 is a flow diagram generally illustrating a method for closed-loop compensation of current measurement offset errors in AC motor drives according to the principles of the present disclosure.

FIG. 3 is a flow diagram generally illustrating a method 300 for electronic compensation of current measurement offset errors in AC motor drives according to the principles of the present disclosure. At 302, the method 300 reads an output voltage command signal. For example, the current regulator 104 may generate the output voltage command signal. At 304, the method 300 extracts a signature of a current measurement offset error from the output voltage command signal. In some embodiments, the output voltage command signal may include just a constant part, and in some embodiments, the output voltage command signal may include a constant part and a sinusoidal part. If the output voltage command signal just includes the constant part, then there may be no current measurement offset error because the sinusoidal part of the output voltage signal represents the pulsations that include the signature of the current measurement offset error. Accordingly, when the output voltage signal includes the constant part and the sinusoidal part, the sinusoidal part is extracted as the signature of the current measurement offset error when the signature has a frequency at a first electrical order, i.e., at the synchronous frequency. The sinusoidal part may correspond to a pulsating portion of the output voltage signal and may result from the current regulator 104 causing the estimated current output from the current estimator 116 to become equal to the commanded current.

In some embodiments, to extract the signature of the current measurement offset error from the output voltage command signal, the method 300 further includes extracting a direct sinusoidal error from the output voltage command signal. In some embodiments, to extract the signature of the current measurement offset error from the output voltage command signal, the method 300 further includes transforming the output voltage command signal to convert the sinusoidal part to a direct current (DC) signature and filters the DC signature.

At 306, the method 300 compensates, based on the signature, for the current measurement offset error in a closed-loop using a feedback path. In some embodiments, the method 300 compensates for the current measurement offset error in real-time (e.g., less than 2 seconds) as the AC motor drive operates the AC motor 112. In some embodiments, the method 300 compensates, based on the signature, for the current measurement offset error in the closed-loop using the feedback path by generating a correction term that compensates for the current measurement offset error, applying the correction to an estimated current to output a compensated estimated current to the current regulator 104, and verifying that a subsequent output voltage signal received from the current regulator 104 via the feedback path does not include the current measurement offset error.

In some embodiments, when the method 300 directly extracts the sinusoidal error as the signature, the method 300 may also compensate, based on the signature, for the current measurement offset error by inputting the signature into an adaptive resonator to output a correction term. The correction term may correct the current measurement offset error. Adaptive resonators may be capable of processing any frequency of alternating current signals. In some embodiments, the method 300 computes the correction terms for the current measurement offset error in a stationary reference frame and adds a transformed final correction term to a synchronous frame estimated current.

In some embodiments, when the method 300 transforms the output voltage command signal to convert the sinusoidal part to the DC signature and filters the DC signature, the method 300 may also compensate, based on the DC signature, for the current measurement offset error by inputting the DC signature into a conventional integrator to output a DC correction term. The DC correction term may correct the current measurement offset error directly in the synchronous reference frame.

In any embodiment, the compensated estimated current may be sent to the current regulator 104 to cause the current regulator 104 to provide an output voltage command signal that lacks the signature of the current measurement offset error.

In some embodiments, a system for compensating for a current measurement offset error in an alternating current (AC) motor drive includes a processor, and a memory that includes instructions. The instructions, when executed, cause the processor to read an output voltage command signal, extract a signature of a current measurement offset error from the output voltage command signal, and compensate, based on the signature, for the current measurement offset error in a closed-loop using a feedback path.

In some embodiments, to compensate, based on the signature, for the current measurement offset error in the closed-loop using the feedback path, the instructions further cause the processor to generate a correction term that compensates for the current measurement offset error, apply the correction term to an estimated current to output a compensated estimated current to a current regulator, and verify that a subsequent output voltage command signal received from the current regulator via the feedback path does not include the current measurement offset error. In some embodiments, compensating for the current measurement offset error occurs in real-time as the AC motor drive operates an AC motor. In some embodiments, to extract the signature of the current measurement offset error from the output voltage command signal, the instructions further cause the processor to extract a direct sinusoidal error from the output voltage command signal. In some embodiments, to compensate, based on the signature, for the current measurement offset error, the instructions further cause the processor to input the signature into an adaptive resonator to output a correction term. In some embodiments, the instructions further cause the processor to compensate for the current measurement offset error in a stationary reference frame by adding the correction terms after transformation to a synchronous frame estimated current. In some embodiments, to extract the signature of the current measurement offset error from the output voltage command signal, the instructions further cause the processor to convert the signature to a DC signal. In some embodiments, to compensate, based on the signature, for the current measurement offset error, the instructions further cause the processor to input the DC signal into a conventional integrator to output a DC correction term. In some embodiments, the instructions further cause the processor to add the DC correction term directly to a synchronous frame estimated current.

In some embodiments, a method for compensating for a current measurement offset error in an alternating current (AC) motor drive includes reading an output voltage command signal, extracting a signature of a current measurement offset error from the output voltage command signal, and compensating, based on the signature, for the current measurement offset error in a closed-loop using a feedback path.

In some embodiments, to compensate, based on the signature, for the current measurement offset error in the closed-loop using the feedback path, the method further includes generating a correction term that compensates for the current measurement offset error, applying the correction term to an estimated current to output a compensated estimated current to a current regulator, and verifying that a subsequent output voltage command signal received from the current regulator via the feedback path does not include the current measurement offset error signature. In some embodiments, the method further includes compensating for the current measurement offset error occurs in real-time as the AC motor drive operates an AC motor. In some embodiments, to extract the signature of the current measurement offset error from the output voltage command signal, the method further includes extracting a sinusoidal component from the output voltage command signal. In some embodiments, to compensate, based on the signature, for the current measurement offset error, the method further includes inputting the signature into an adaptive resonator to output a correction term. In some embodiments, the method further includes compensating for the current measurement offset error by transforming the correction term in a stationary reference frame and adding it to an estimated synchronous frame current. In some embodiments, to extract the signature of the current measurement offset error from the output voltage command signal, the method further includes converting the signature to a DC signal. In some embodiments, to compensate, based on the signature, for the current measurement offset error, the method further includes inputting the DC signal into a conventional integrator to output a DC correction term. In some embodiments, the method further includes adding the DC correction to an estimated synchronous frame current and compensating for the current measurement offset error directly in a synchronous reference frame.

In some embodiments, an electronic device includes a processor and a memory storing instructions. The instructions, when executed, cause the processor to read an output command voltage signal, extract a signature of a current measurement offset error from the output voltage command signal, and compensate, based on the signature, for the current measurement offset error in a closed-loop using a feedback path.

In some embodiments, to extract the signature of the current measurement offset error from the output voltage command signal, the instructions further cause the processor to extract a sinusoidal component from the output voltage command signal. In some embodiments, to compensate, based on the signature, for the current measurement offset error, the instructions further cause the processor to input the signature into an adaptive resonator to output a correction term. In some embodiments, the instructions further cause the processor to compensate for the current measurement offset error by transforming the correction term in a stationary reference frame and adding it to an estimated synchronous frame current. In some embodiments, to extract the signature of the current measurement offset error from the output voltage command signal, the instructions further cause the processor to convert the signature to a DC signal. In some embodiments, to compensate, based on the signature, for the current measurement offset error, the instructions further cause the processor to input the DC signal into a conventional integrator to output a DC zero command. In some embodiments, the instructions further cause the processor to convert the DC zero command to a sinusoidal zero command and compensate for the current measurement offset error in a stationary reference frame by applying the sinusoidal zero command to a d/q measured current.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

The word "example" is used herein to mean serving as an example, instance, or illustration. Any aspect or design described herein as "example" is not necessarily to be construed as preferred or advantageous over other aspects or designs. Rather, use of the word "example" is intended to present concepts in a concrete fashion. As used in this application, the term "or" is intended to mean an inclusive "or" rather than an exclusive "or." That is, unless specified otherwise, or clear from context, "X includes A or B" is intended to mean any of the natural inclusive permutations. That is, if X includes A; X includes B; or X includes both A and B, then "X includes A or B" is satisfied under any of the foregoing instances. In addition, the articles "a" and "an" as used in this application and the appended claims should generally be construed to mean "one or more" unless specified otherwise or clear from context to be directed to a singular form. Moreover, use of the term "an implementation" or "one implementation" throughout is not intended to mean the same embodiment or implementation unless described as such.

Implementations the systems, algorithms, methods, instructions, etc., described herein can be realized in hardware, software, or any combination thereof. The hardware can include, for example, computers, intellectual property (IP) cores, application-specific integrated circuits (ASICs), programmable logic arrays, optical processors, programmable logic controllers, microcode, microcontrollers, servers, microprocessors, digital signal processors, or any other suitable circuit. In the claims, the term "processor" should be understood as encompassing any of the foregoing hardware, either singly or in combination. The terms "signal" and "data" are used interchangeably.

As used herein, the term module can include a packaged functional hardware unit designed for use with other components, a set of instructions executable by a controller (e.g., a processor executing software or firmware), processing circuitry configured to perform a particular function, and a self-contained hardware or software component that interfaces with a larger system. For example, a module can include an application specific integrated circuit (ASIC), a Field Programmable Gate Array (FPGA), a circuit, digital logic circuit, an analog circuit, a combination of discrete circuits, gates, and other types of hardware or combination thereof. In other embodiments, a module can include memory that stores instructions executable by a controller to implement a feature of the module.

Further, in one aspect, for example, systems described herein can be implemented using a general-purpose computer or general-purpose processor with a computer program that, when executed, carries out any of the respective methods, algorithms, and/or instructions described herein. In addition, or alternatively, for example, a special purpose computer/processor can be utilized which can contain other hardware for carrying out any of the methods, algorithms, or instructions described herein.

Further, all or a portion of implementations of the present disclosure can take the form of a computer program product accessible from, for example, a computer-usable or computer-readable medium. A computer-usable or computer-readable medium can be any device that can, for example, tangibly contain, store, communicate, or transport the program for use by or in connection with any processor. The medium can be, for example, an electronic, magnetic, optical, electromagnetic, or a semiconductor device. Other suitable mediums are also available.

The above-described embodiments, implementations, and aspects have been described in order to allow easy understanding of the present invention and do not limit the present invention. On the contrary, the invention is intended to cover various modifications and equivalent arrangements included within the scope of the appended claims, which scope is to be accorded the broadest interpretation to encompass all such modifications and equivalent structure as is permitted under the law.

What is claimed is:

1. A system for compensating for a current measurement offset error in an alternating current (AC) motor drive, the system comprising:
   a processor; and
   a memory that includes instructions that, when executed by the processor, cause the processor to:
   read an output voltage command signal, the output voltage command signal being configured to control the AC motor drive;
   detect a current measurement offset error from the output voltage command signal;
   extract a signature of the current measurement offset error from the output voltage command signal, wherein the signature corresponds to a pulsating frequency of a first electrical order in the output voltage command signal; and
   compensate, based on the signature, for the current measurement offset error in a closed-loop using a feedback path, the closed-loop being associated with the AC motor drive.

2. The system of claim 1, wherein to compensate, based on the signature, for the current measurement offset error in the closed-loop using the feedback path, the instructions further cause the processor to:
   generate a correction term that compensates for the current measurement offset error; and
   apply the correction term to an estimated current to output a compensated estimated current to a current regulator.

3. The system of claim 1, wherein compensating for the current measurement offset error occurs in real-time as the AC motor drive operates an AC motor.

4. The system of claim 1, wherein to extract the signature of the current measurement offset error from the output voltage command signal, the instructions further cause the processor to extract a sinusoidal component at synchronous frequency from the output voltage command signal.

5. The system of claim 4, wherein to compensate, based on the signature, for the current measurement offset error, the instructions further cause the processor to input the signature into an adaptive resonator to output a correction term.

6. The system of claim 5, wherein the instructions further cause the processor to compensate for the current measurement offset error in synchronous reference frame by transforming the correction term and adding it to an estimated synchronous frame current.

7. The system of claim 1, wherein to extract the signature of the current measurement offset error from the output voltage command signal, the instructions further cause the processor to convert the signature to a DC signal.

8. The system of claim 7, wherein to compensate, based on the signature, for the current measurement offset error, the instructions further cause the processor to input the DC signal into a conventional integrator to output a DC correction term.

9. The system of claim 8, wherein the instructions further cause the processor to apply the DC correction term to a synchronous frame estimated current to directly compensate for the current measurement offset error in a synchronous reference frame.

10. A method for compensating for a current measurement offset error in an alternating current (AC) motor drive, the method comprising:
  reading an output voltage command signal, the output voltage command signal being configured to control the AC motor drive;
  detect a current measurement offset error from the output voltage command signal;
  extracting a signature of the current measurement offset error from the output voltage command signal, wherein the signature corresponds to a pulsating frequency of a first electrical order in the output voltage command signal; and
  compensating, based on the signature, for the current measurement offset error in a closed-loop using a feedback path, the closed-loop being associated with the AC motor drive.

11. The method of claim 10, wherein to compensate, based on the signature, for the current measurement offset error in the closed-loop using the feedback path, the method further comprises:
  generating a correction term command that compensates for the current measurement offset error; and
  applying the correction term to an estimated current to output a compensated estimated current to a current regulator.

12. The method of claim 10, further comprising compensating for the current measurement offset error occurs in real-time as the AC motor drive operates an AC motor.

13. The method of claim 10, wherein to extract the signature of the current measurement offset error from the output voltage command signal, the method further comprises extracting a sinusoidal component at synchronous frequency from the output voltage command signal.

14. The method of claim 13, wherein to compensate, based on the signature, for the current measurement offset error, the method further comprises inputting the signature into an adaptive resonator to output a correction term.

15. The method of claim 14, further comprising directly compensating for the current measurement offset error in a stationary reference frame by transforming the correction term and adding it to an estimated synchronous frame current.

16. The method of claim 10, wherein to extract the signature of the current measurement offset error from the output voltage command signal, the method further comprises converting the signature to a DC signal.

17. The method of claim 16, wherein to compensate, based on the signature, for the current measurement offset error, the method further comprises inputting the DC signal into a conventional integrator to output a DC correction term.

18. The method of claim 17, further comprising applying the DC correction term to a synchronous frame estimated current to directly compensate for the current measurement offset error in a synchronous reference frame.

19. An electronic device comprising:
  a processor; and
  a memory that includes instructions that, when executed by the processor, cause the processor to:
  read an output voltage command signal, the output voltage command signal being configured to control an alternating current (AC) motor drive;
  detect a current measurement offset error from the output voltage command signal;
  extract a signature of a current measurement offset error from the output voltage command signal, wherein the signature corresponds to a pulsating frequency of a first electrical order in the output voltage command signal; and
  compensate, based on the signature, for the current measurement offset error in a closed-loop using a feedback path, the closed-loop being associated with the AC motor drive.

20. The electronic device of claim 19, wherein:
  to extract the signature of the current measurement offset error from the output voltage command signal, the instructions further cause the processor to convert the signature to a DC signal;
  to compensate, based on the signature, for the current measurement offset error, the instructions further cause the processor to input the DC signal into a conventional integrator to output a DC correction term; and
  the instructions further cause the processor to apply the DC correction term to a synchronous frame estimated current to directly compensate for the current measurement offset error in a synchronous reference frame.

* * * * *